United States Patent
Juneja et al.

(10) Patent No.: US 8,839,183 B2
(45) Date of Patent: Sep. 16, 2014

(54) METHOD AND APPARATUS FOR DERIVED LAYERS VISUALIZATION AND DEBUGGING

(71) Applicant: Cadence Design Systems, Inc., San Jose, CA (US)

(72) Inventors: Pardeep Juneja, Delhi (IN); Sanjiib Ghosh, Uttar Pradesh (IN); Harindranath Parameswaran, Uttar Pradesh (IN)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/756,022

(22) Filed: Jan. 31, 2013

(65) Prior Publication Data

US 2014/0215422 A1 Jul. 31, 2014

(51) Int. Cl.
*G06F 17/50* (2006.01)

(52) U.S. Cl.
CPC .................................. *G06F 17/5081* (2013.01)
USPC .............. 716/139; 716/136; 716/112; 716/52

(58) Field of Classification Search
None
See application file for complete search history.

(56) References Cited

U.S. PATENT DOCUMENTS

| | | | | |
|---|---|---|---|---|
| 5,812,415 | A * | 9/1998 | Baisuck | 716/52 |
| 6,606,735 | B1 * | 8/2003 | Richardson et al. | 716/112 |
| 6,611,946 | B1 * | 8/2003 | Richardson et al. | 716/112 |
| 7,254,791 | B1 * | 8/2007 | Agrawal et al. | 716/112 |
| 7,665,045 | B1 * | 2/2010 | Nequist | 716/104 |
| 7,797,652 | B2 * | 9/2010 | Monkowski et al. | 716/136 |
| 8,069,426 | B2 * | 11/2011 | Nequist | 716/106 |
| 8,136,060 | B1 * | 3/2012 | Nequist | 716/100 |
| 8,438,531 | B2 * | 5/2013 | Majumder et al. | 716/139 |
| 8,555,237 | B1 * | 10/2013 | Juneja et al. | 716/139 |
| 2012/0131524 | A1 * | 5/2012 | Nequist | 716/103 |

* cited by examiner

*Primary Examiner* — Leigh Garbowski
(74) *Attorney, Agent, or Firm* — Sawyer Law Group, P.C.

(57) ABSTRACT

A computer-implemented method, system and computer program product for visualizing derived layer shapes of an integrated circuit design are disclosed. The computer-implemented method, system and computer program product include visualizing the derived layer shapes on a layout canvas; providing a step by step process for visualizing each derived layer shape as each derived layer shape is generated; and providing a hierarchy of intermediate derived layers based upon the step by step process.

21 Claims, 24 Drawing Sheets

| | ( minSpacing | "PO" "nregion_active_od_g" | | | 5.0 | 'ref |
|---|---|---|---|---|---|---|
| "techRefString" ) | | | | | | |
| | where PO | -> Physical Layer | | | | |
| | | nregion_active_od_g -> Derived Layer | | | | |
| techDerivedLayers( | | | | | | |
| | ;(DerivedLayerName | # | composition | | | |
| | ( ndiff | 10211 | (OD | 'and | NN | |
| | (NMINUS_ACTIVE | 10215 | ( ndiff | 'touching | NW | |
| | ( od_32_x | 10241 | (OD_25 | 'touching | OD_54 | |
| | ( OD_32 | 10252 | ( od_32_x | 'inside | od_32_y | |
| | (nregion_active_od | 10299 | ( NMINUS_ACTIVE | 'or | OD_32 | |
| | (nregion_active_od_g | 10307 | (nregion_active_od | 'grow | .1 | |
| ); | | | | | | |
| Where | | OD, NN, OD_25, OD_54, NW, od_32_y  are Physical Layers | | | | |

Figure 1E

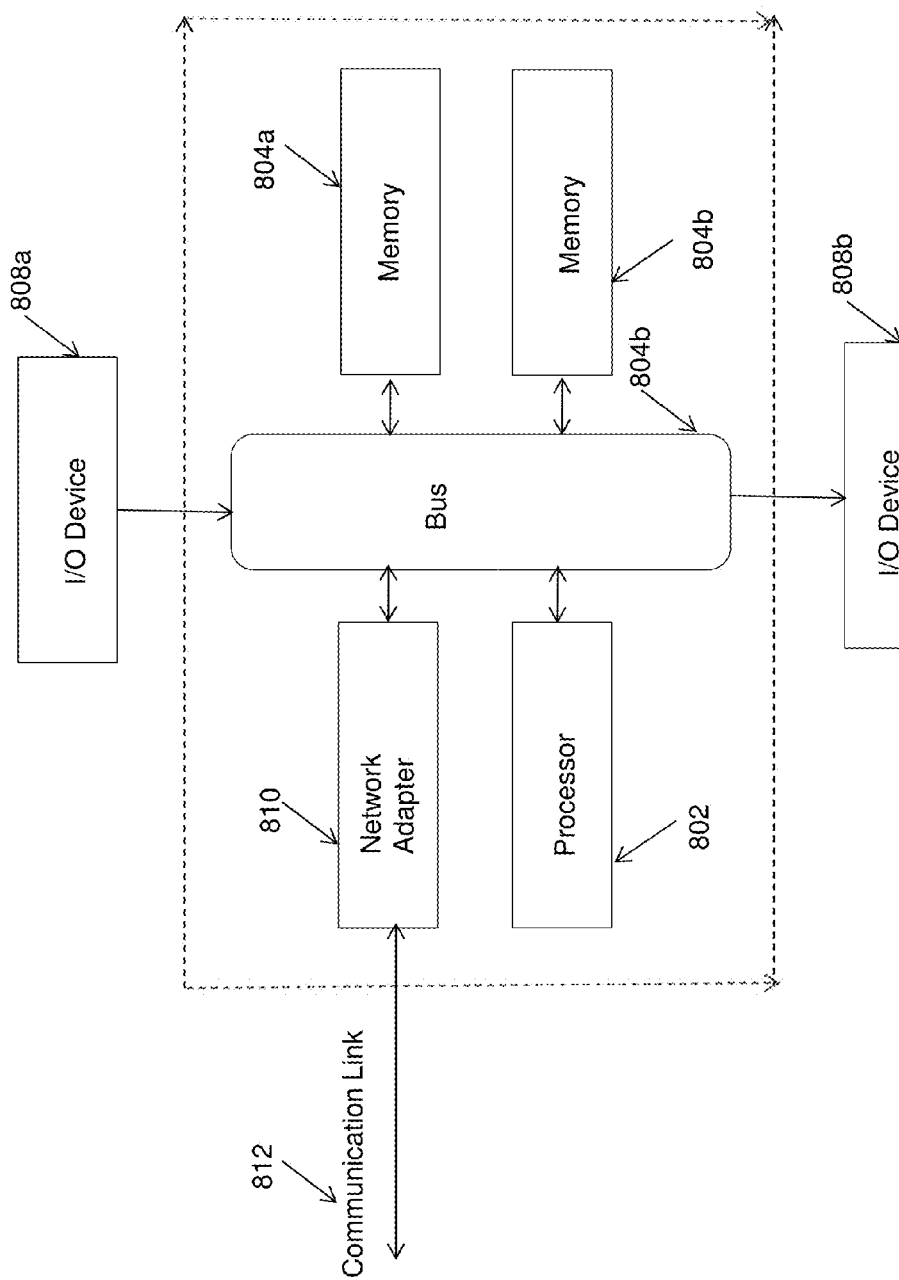

METHOD AND APPARATUS FOR DERIVED LAYERS VISUALIZATION AND DEBUGGING

FIELD OF THE INVENTION

The present invention relates generally to integrated circuit design and more specifically to a method and system for visualizing design rule violations on derived layers in such devices.

BACKGROUND

The physical layout of a very-large scale integration ("VLSI") design has to adhere to certain design rules. Typically a Design Rule Checking (DRC) tool is utilized to ensure that a given layout conforms to the set of design rules. The design rules, provided by the manufacturer and specific to a process node, are necessary to ensure the devices are manufacturable and can be produced at an appropriate yield. The design rules may be applicable to physical shapes or shapes that are derived from physical shapes using geometric operations. The shapes that are derived from physical shapes are said to reside on a derived layer and are referred to as derived layer shapes.

Oftentimes contemporary DRC tools do not provide enough information to allow for the visualization of a violation by a derived layer shapes because all that can be determined is textual description of a constraint that failed and which layers are involved in the violation. Typically, to repair the violation by using the textual description and which layers are involved is extremely time-consuming and error-prone, leading to a substantial loss in productivity and turnaround time when producing the design.

Accordingly, what is needed is a system and method to address the above identified issues. The system and method should be easily implemented, cost effective and adaptable to existing environments. The present invention addresses such a need.

SUMMARY OF THE INVENTION

A computer-implemented method, system and computer program product for visualizing derived layer shapes of an integrated circuit design are disclosed. The computer-implemented method, system and computer program product include visualizing the derived layer shapes on a layout canvas; providing a step by step process for visualizing the generation of each derived layer shape; and providing a hierarchy of intermediate derived layers based upon the step by step process.

Other aspects and advantages of the present invention will become apparent from the following detailed description, taken in conjunction with the accompanying drawings which illustrate, by way of example, the principles of the invention.

BRIEF DESCRIPTION OF THE DRAWINGS

FIG. 1E is an example of minClearance as represented in minSpacing in Techfile.

FIG. 17 illustrates a data processing system suitable for storing the computer program product and/or executing program code in accordance with an embodiment.

DETAILED DESCRIPTION OF PREFERRED EMBODIMENTS

Figure 1A:
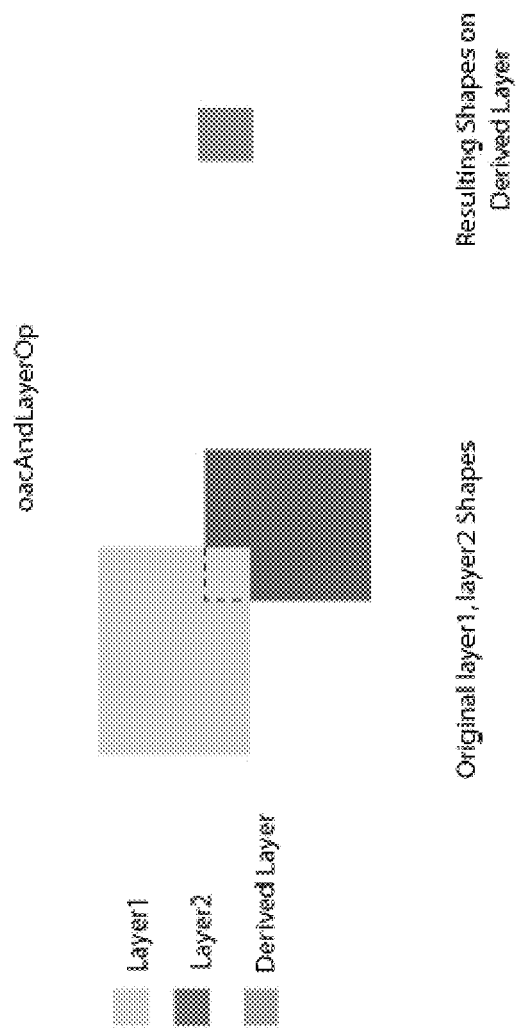
FIG. 1A is an example showing which shapes are selected and included in a derived layer when this type of layer operation is used.

The present invention relates generally to integrated circuit design and more specifically to a method and system for visualizing violations in such devices. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiments shown but are to be accorded the widest scope consistent with the principles and features described herein.

Fixing Derived Layers Violation Issues

The physical layout of a deep submicron VLSI design has to adhere to certain Design Rules (or Design Constraints) dictated mostly by the technology used to fabricate the design. It is the task of a Design Rule Checker (DRC) tool/module to ensure that a given layout conforms to an applicable set of design rules. The rules, provided by the manufacturer and specific to a process node, are required to ensure manufacturability and yield. These rules may be applicable to actual physical shapes or to abstract shapes that are derived from the physical ones using geometric operations (shapes that are thus derived from physical shapes are said to reside on a "derived layer"). If the layout does not adhere to one or more of these rules, then the tool has to inform the designer about (design rule) violations, and designer has to fix each of them before the design is considered design rule clean. In older process nodes and above), it was enough for a DRC tool/module to inform the designer about two things:

Which design rule was violated?

Which area of the layout did the violation occur in?

In most cases, this information was sufficient for the designer to understand the underlying reason for a violation, thereby equipping her to effectively fix the violation.

However in the present environment, the situation is very different. Not only are the design rules extremely complex, they are often applied to abstract shapes that are derived using a hierarchy of geometric operations on physical shapes. In this scenario the task of the designer in understanding and fixing a violation becomes extremely difficult.

In the present application, "derived layer," "derived layer shape" and "derived layer geometry" can be interchanged in many instances. Derived layers comprise a set of derived layer shapes or derived layer geometries, and derived layer shapes or derived layer geometries reside only on a specific derived layer. There are several reasons why derived layer shapes are used to specify constraints. The derived layer shape could be to easily represent an abstract (but electrically relevant) region like the "gate" of a transistor, or shape could be to simplify the specification of a very complex design rule. Derived layer shapes are also used to create intermediate abstract shapes that can be used in multiple rules.

A derived layer operation can be for example, one of the OpenAccess built-in types or a custom type defined by the application. Examples of derived layer operators are shown in the table below:

| AND | OR | NOT | XOR | GROW |
|---|---|---|---|---|
| INSIDE | OUTSIDE | COINCIDENT | COINCIDENT_ONLY | SHRINK |
| BUTTING | STRADDLING | OVERLAPPING | BUTTING_OR_COINCDENT | GROW_VERTICAL |
| SELECT | AVOIDING | BUTTONLY | BUTTING_OR_OVER-LAPPING | GROW_HORIZONTAL |
| AREA | TOUCHING | ENCLOSING | SHRINK_VERTICAL | SHRINK_HORIZONTAL |

These operators can have different parameters to specify how a particular layer is derived.

For example, the table below illustrates parameters and their description:

| Parameter | Description |
|---|---|
| Connectivity type | specifies which shapes should be selected (Same Net/Diff Net/None) |
| Range Type | specifies to select those shapes which satisfy range type and value |
| Purpose Type | specifies to select shapes on physical layer with a defined purpose |
| Area Range type | specifies to select those shapes which meets area range criteria |
| Distance Type | specifies the distance for expand/shrink operations |

Figure 1B:
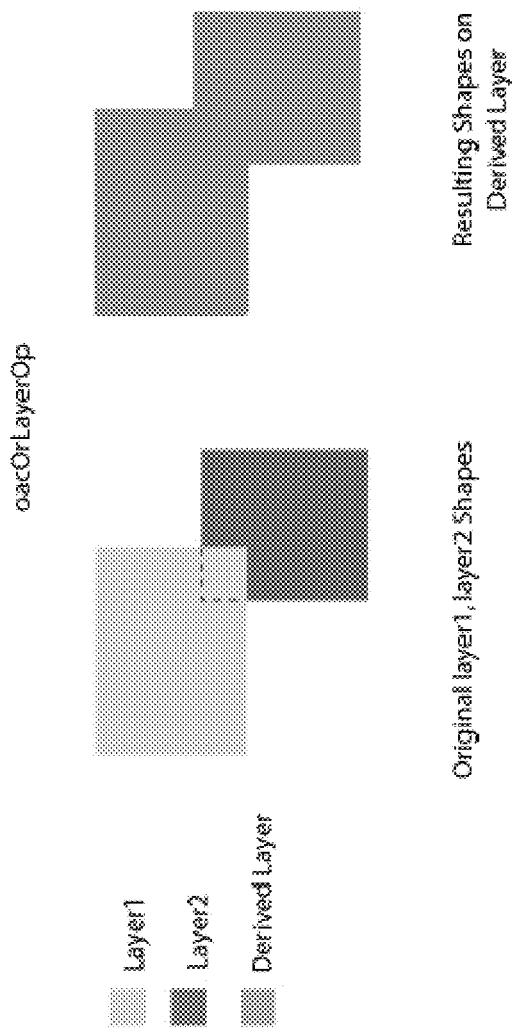
FIG. 1B is an example showing which shapes are selected and included in a derived layer when this type of layer operation is used.
Figure 1C:
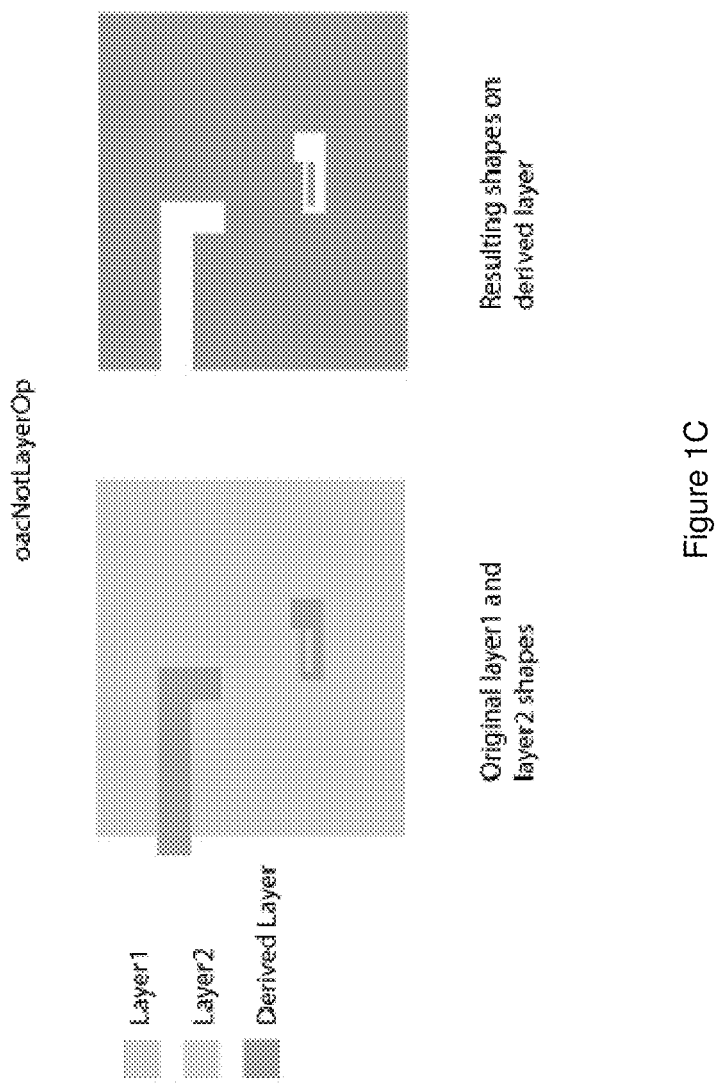
FIG. 1C is an example showing which shapes are selected and included in a derived layer when this type of layer operation is used.

To provide a more detailed view of derived layer operators, examples of typical derived layers operations as used in the OpenAccess database are illustrated in FIGS. 1A-1C and are described in more detail below.

AND (oacAndLayerOp)

An AND layer operation requires that two layers are specified. This operation creates shapes on the derived layer that correspond to the areas on layer1 and layer2 that intersect each other. FIG. 1A is an example showing which shapes are selected and included in a derived layer when this type of layer operation is used.

OR (oacOrLayerOp)

An OR layer operation also requires that two layers are specified. This operation creates shapes on the derived layer that correspond to a union of the shapes on layer1 and layer2. FIG. 1B is an example showing which shapes are selected and included in a derived layer when this type of layer operation is used.

NOT (oacNotLayerOp)

An NOT layer operation requires that two layers are specified. This operation creates shapes on the derived layer that correspond to an inversion of the layer2 shape and the layer1 shapes. FIG. 1C is an example showing which shapes are selected and included in a derived layer when this type of operation is used.

As can be seen by the above, the specification for a design rule could be complicated by the following factors:

The specification can involve multiple derived layers which can be comprised of physical layers or recursive derived layer specification As can be seen from the list above, there are a large number of operations associated with derived layer shape generation. These operations can also be combined hierarchically.

As a result of the above factors, when a violation related to derived layer shapes occurs and is presented to the designer by a DRC tool, it is increasingly complex for her to figure out the following:

What exactly went wrong?

What were the underlying physical shapes, and how was the derived layer shape created using those shapes. This is important because the fix of the violation will involve manipulation of one or more of the physical shapes that contributed to create the derived layer shape associated with the violation in question How to map a reported violation to corresponding scenario found in constraint specification?

How to fix the violation?

As seen from the above description, fixing a design violation where one or more derived layers are included in the design can be an extremely complex operation. The complexity occurs because as changes are made on the physical layers, the derived layer shapes are generated by multiple derived layer geometric operations on multiple physical layers. Accordingly, the user does not have a complete visualization of how the derived layer shapes are generated from the physical layers before attempting to fix the design violation.

Figure 1D:
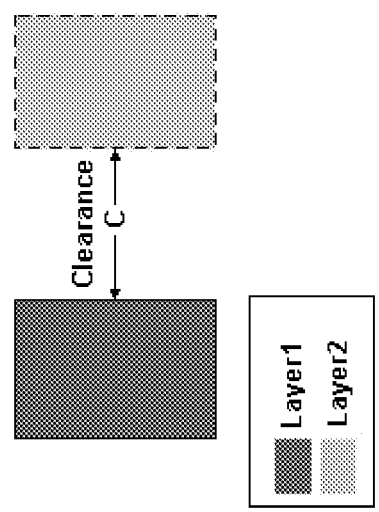
FIG. 1D is an example of a constraint represented in an OpenAccess (OA) database as a Clearance.

As an example, a derived layer constraint represented in the OpenAccess ("OA") database from the Silicon Integration Initiative is minClearance. Clearance constraints as shown in FIG. 1D apply only to edges that have no intersections. Clearances are specified from the outside edge of the shape on the first layer to the outside edge of the shape on the second layer. These types of constraint violations are more easily understood and are relatively easy to repair when layer 1 and layer 2 are physical layers.

A minClearance layer pair constraint specifies the minimum separation between two different shapes on two different layers. The minClearance layer pair constraint becomes more difficult to understand with the introduction of derived layers.

Figure 1F:
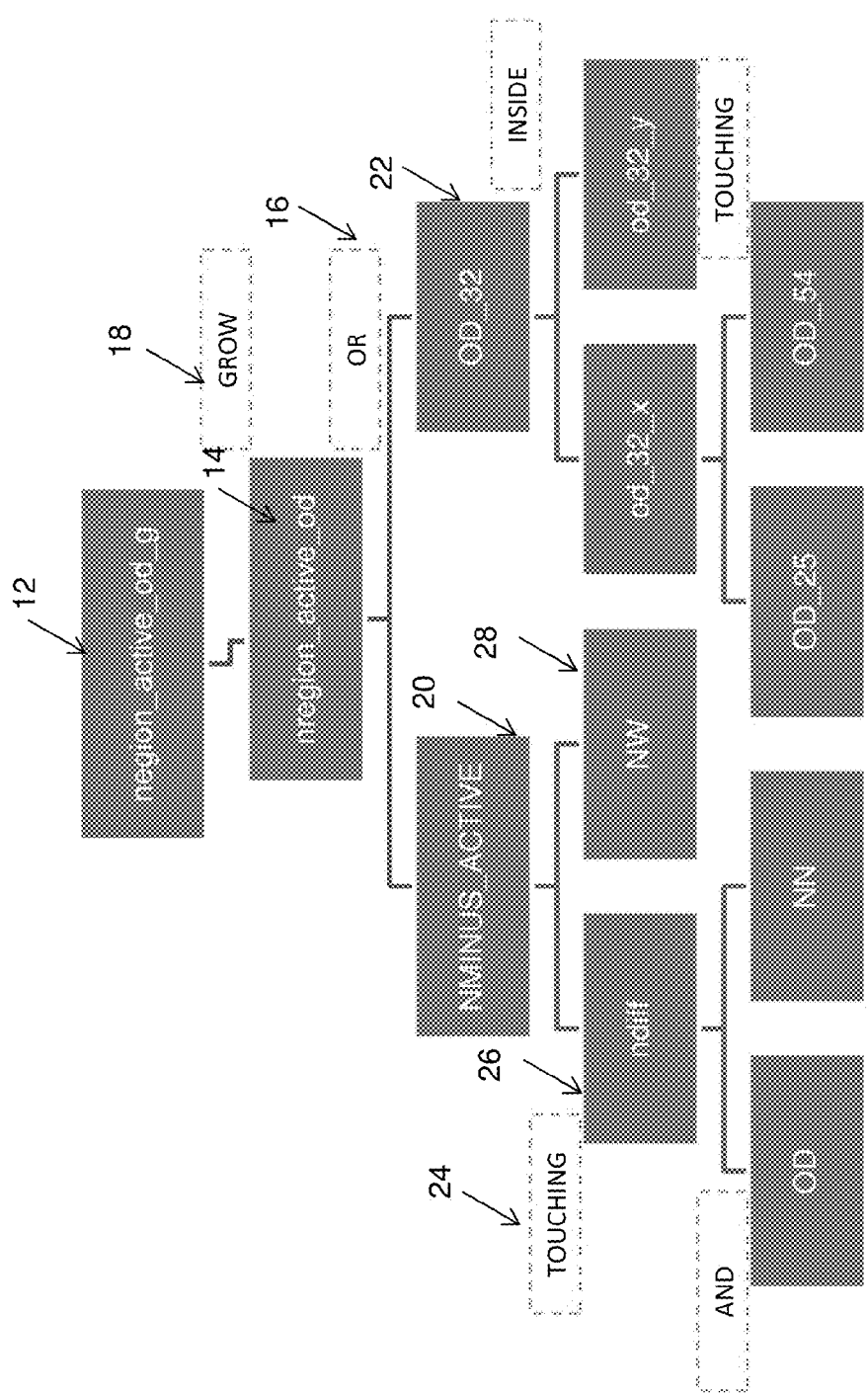
FIG. 1F illustrates derived layer shape function.

Referring now to FIGS. 1E and 1F, the minClearance constraint is represented as minSpacing in a sample Techfile shown in FIG. 1E and in hierarchical form in FIG. 1F. Referring to FIG. 1F, for example, it can be seen that nregion_active_od_g shapes 12 are generated by applying GROW operator 18 to nregion_active_od layer shapes 14. Nregion_active_od shapes 14 are again derived layer shapes which are generated by applying OR operator 16 between NMINUS_ACTIVE and OD_32 shapes 20 and 22. NMINUS_ACTIVE shapes 20 are in turn derived layer shapes generated by applying TOUCHING operator 24 between ndiff 26 and NW layer 28 shapes. Similar logic applies for rest of derived layer shape formation.

Contemporary DRC tools typically utilize rectangles that highlight the error region, and a textual description of the constraint that failed for derived layer shapes. However, considering the complexity of the constraint and two aspects—one of interplay of the number of physical layers involved in derived layers shapes creation—and the other of the interplay of various complex derived layer operators used in specification, it is extremely hard for the designer to determine the complete context of the error. The designer has to go back and forth between the layout and the documentation to understand the underlying specification of the derived layer in order to determine the exact derived layer shapes and reasons for the violation. The designer has to painstakingly change the physical layer visibility level on the canvas and figure out the derived layer shape creation of the various physical layers. The designer thus has to go through a time-consuming and error-prone process before a strategy can be determined to fix the violation. This increases the total turnaround time and thus cost, to arrive at a design rule clean design.

Figure 2:
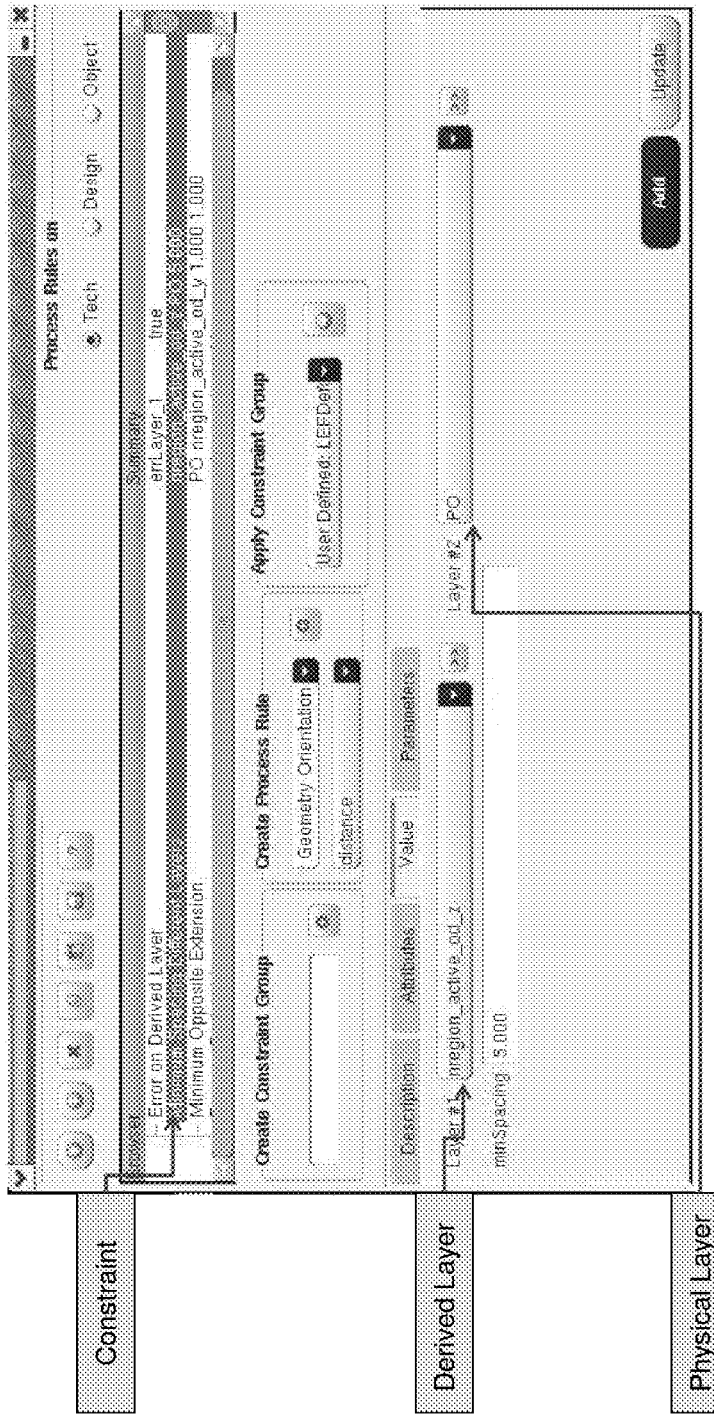
FIG. 2 is a sample screenshot that shows an example of a minimum spacing constraint specification on derived layer and physical layer.
Figure 3:
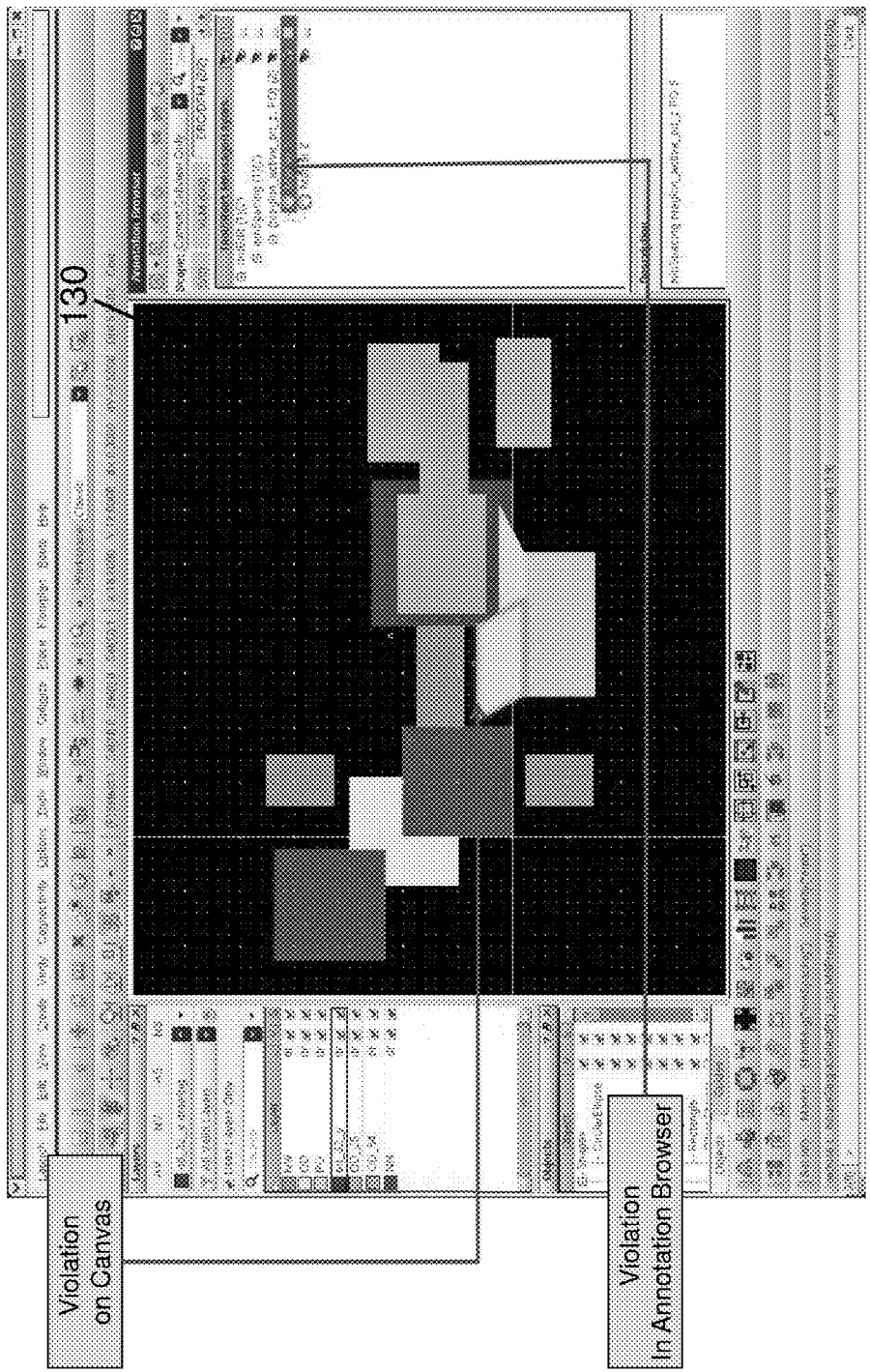
FIG. 3 is a sample screenshot that shows the violation on a canvas and violation in another browser.

FIG. 2 is a sample screenshot that shows an example of a minimum spacing constraint specification on a derived layer and a physical layer. This constraint specification can also be between multiple derived layers. As is seen there is an error on the derived length. FIG. 3 is a sample screenshot that shows the violation on a canvas and violation in an annotation browser.

The conventional system, as shown through FIGS. 2 and 3, provides information about the violation region, type of violation and layer names involved in each violation. However, it does not show information about: (1) the derived layer geometries between which violation is flagged; (2) how derived layer geometries were generated; and (3) how derived layer operators were applied on constituent layer geometries. Utilizing the conventional system, there is no way to visualize derived layer geometries on the canvas.

Derived Layer Visualization and Debugging

A method and system in accordance with the present invention provides an infrastructure and methodology that provides a user with a way to "visualize" the derived layer geometries and associated design rule violations in their layout in a way that is: (1) easy for the users to understand the problem in its entirety within the context of the layout; (2) possible for the users to relate it to the actual constraint and the detailed information from the constraint that came into play to cause the violation; and (3) capable of having a close look at each or a desired set of derived layer violation shapes and visualize the set of derived layer violation shapes in detail. The user can also obtain a step by step visualization of intermediate shapes involved in derived layer shapes, generated through hierarchy of physical/derived layers, and get a comprehensive explanation of all operators applied at each individual step.

These details should be presented to the user in an easily accessible way, both visually, in the context of the layout canvas, and detailing all of the intermediate derived layer and bottom level physical layer geometries on the layout canvas that have caused the violation. The details will also indicate which operator was applied at each individual step of derived layer geometry generation; which constraint was violated in the layout, and what the various parts of that constraint were in the context of, and in relation to, the area of the violation. The user should also be provided with detailed documentation that can be loaded and/or interpreted in a separate viewer or tool.

A derived layer visualization and debugger system is disclosed that can be coupled with a DRC tool/module or be its own improved, standalone DRC tool/module. The system is designed to enable a designer to perform the following tasks: (1) Obtain a comprehensive overview of all derived layers used in a layout; and have a close look at each or a desired set of derived layer violation shapes and visualize them in detail. (2) Obtain a step by step visualization of intermediate shapes involved in derived layer shapes, generated through hierarchy of physical/derived layers. (3) Obtain comprehensive explanations of all operators applied at individual steps.

The derived layer visualization and debugger system provides a user with a complete and comprehensive overview of the derived layer geometries generation. This includes in final derived layer shapes generated mode (in which derived layer can be selectively turned on/off from canvas via derived layer palette), in a step by step manner (in which the user can see each intermediate step in an animated way for derived layer generation).

The derived layer visualization and debugger system will enable the user to see how various physical layer geometries affect the intermediate and final derived layer geometries generation and lead to violation between final geometries, thereby viewing the problem, and being able to apply the right set of strategies to repair the problem completely. The details of geometries are visually presented to the user in the context of the layout canvas, detailing all the physical and intermediate derived layer geometries in the canvas that to have caused the violation, as well as which operators were applied, which constraint was violated in the layout, and what the various parts of that constraint were in the context of, and related to the area of, the violation. In short, the derived layer visualization and debugger system provides whatever information the user would need in order to quickly visualize the derived layer geometry generation, assess the various methods to fix this violation, and then to actually fix it.

Figure 4A:
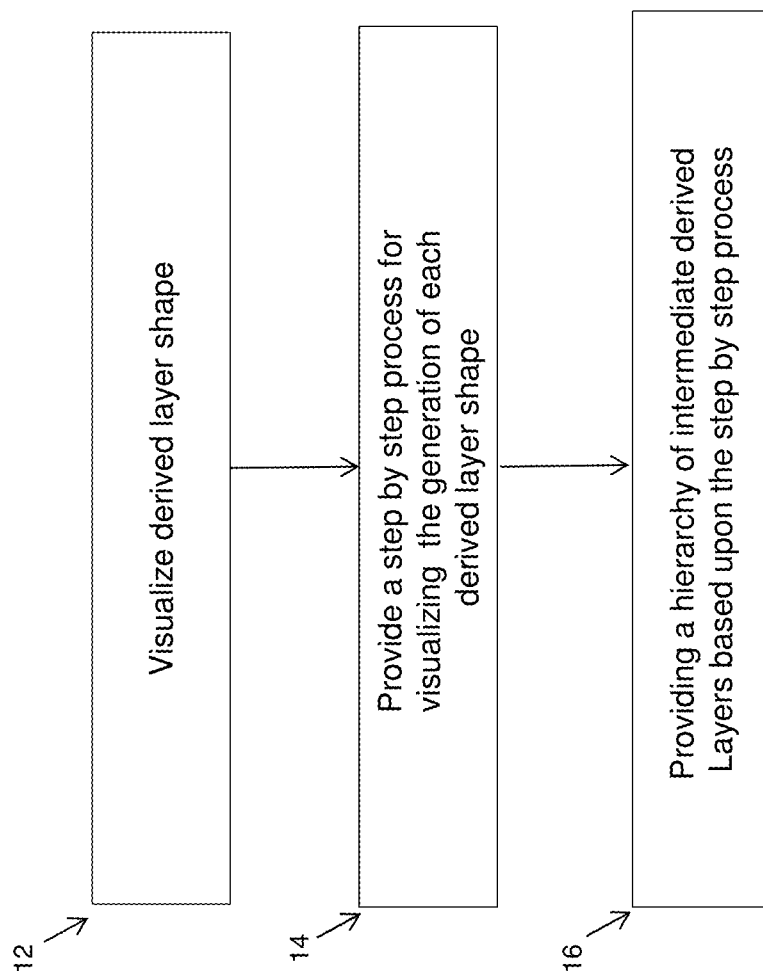
FIG. 4A is a flow chart illustrating the operation of the derived layer visualization and debugger system in accordance with an embodiment.

FIG. 4A is a flow chart illustrating the operation of the derived layer visualizer and debugger system in accordance with an embodiment. First, a derived layer shape is produced on canvas, via operation 12. Second, a step by step procedure to reach a final derived layer shape is provided, via operation 14. Finally a hierarchy of physical and intermediate derived layers is provided based upon the step by step process, via operation 16. The derived layers geometries visualization is filtered on basis of constraints applied in the design. To describe the features of the present invention in more detail, refer now to the following description in conjunction with the accompanying Figures.

Derived Layer Visualization and Debugger System Overview

Figure 4B:
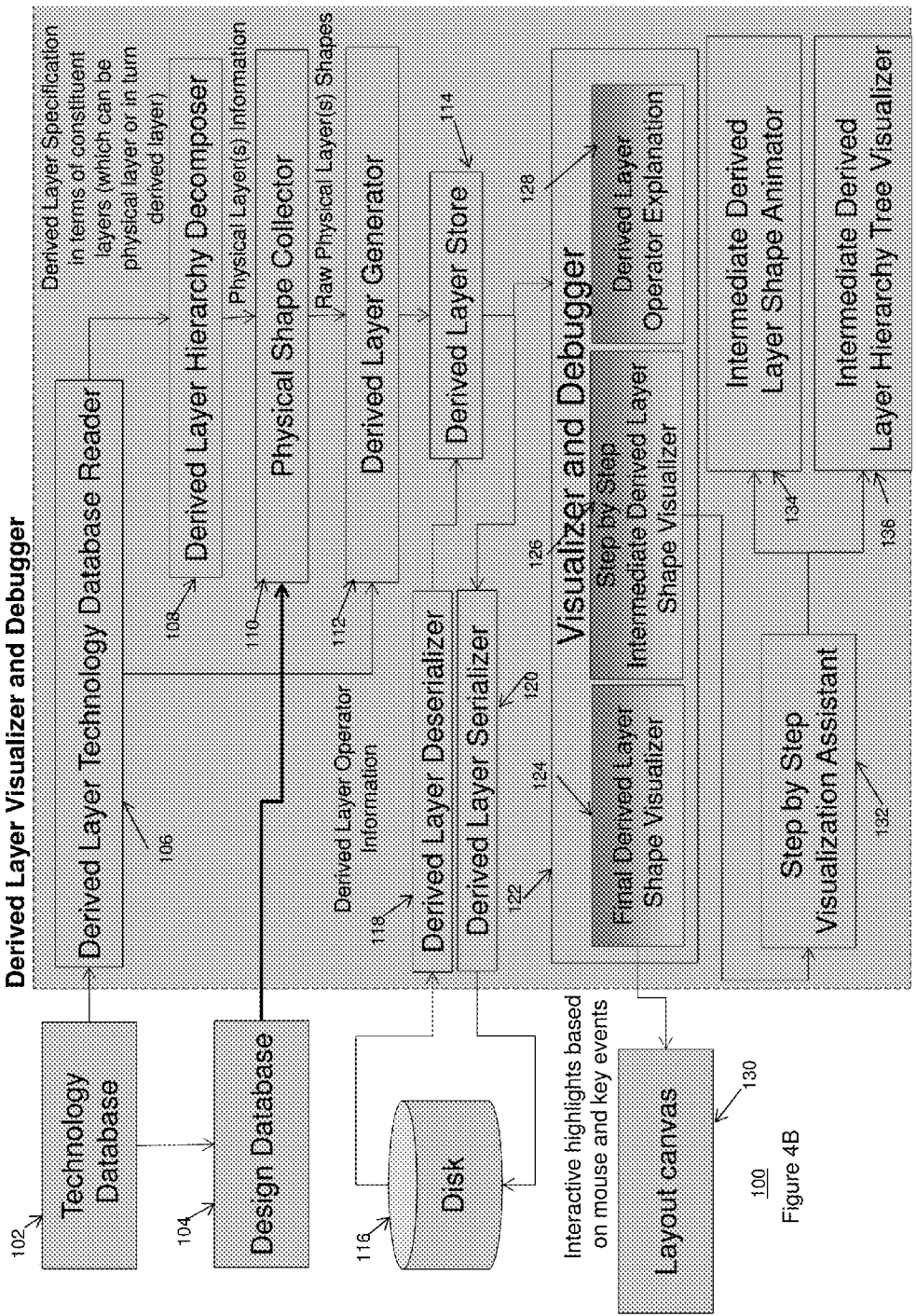
FIG. 4B presents an overview of the system and the way in which it is plugged with external elements.

FIG. 4B is a block diagram of a derived layer visualization and debugger system 100 in accordance with the present invention. The system 100 comprises a Technology Database 102, a Design Database 104, Derived Layer Technology Database Reader 106, a Derived Layer Hierarchy Decomposer 108, a Physical Shape Collector 110, a Derived Layer Generator 112, a Derived Layer Store 114, a Disk 116, a Derived Layer Deserializer 118, a Derived Layer Serializer 120, a Derived Layer Visualizer Debugger 122, a Final Derived Layer Shape Visualizer 124, a Step by Step Intermediate Derived Layer Shape Visualizer 126, a layout canvas 130, a Step by Step Visualization Assistant 132, an Intermediate Derived Layer Shape Animator 134, an Intermediate Derived Layer Hierarchy Tree Visualizer 136, and a Derived Layer Operator Explanation 128. The operation of these elements will be described in detail below.

1. Derived Layer Technology Database Reader 106

The Derived Layer Technology Database Reader 106 parses the technology database 102 for the derived layers section and reads all specified derived layers along with specified operators and parameters values.

2. Derived Layer Hierarchy Decomposer 108

The derived layers can be specified in terms of raw physical layers or other derived layers. The Derived Layer Hierarchy Decomposer 108 decomposes a derived layer specification into a tree structure in which non-leaf nodes represent intermediate derived layers and leaf level nodes represent physical layers. All non-leaf nodes store their respective operator and parameters information.

3. Physical Shape Collector 110

The Physical Shape Collector 110 is responsible for collecting physical layer(s) shapes from design database 104 which are required either for generation of intermediate derived layer(s) or final derived layer(s). The Physical Shape Collector 110 collect shapes within a particular area, layer purpose, shape net, etc. from the design database 4. Derived Layer Generator 112

The Derived Layer Generator 112 is responsible for generating derived layers by applying derived layer operators on physical layer shapes. The derived layers can be specified in terms of raw physical layers or in terms of other derived layers also. The Derived Layer Generator 112 generates an intermediate hierarchy of constituent derived layers with an optimized cached mechanism to avoid multiple generations of these intermediate derived layers across a session. The Derived Layer Generator 112 takes into account the connectivity specification (Same Net/Diff Net), selection of shapes with particular purpose, sizing, range selection and other applicable parameters in addition to applying the derived layer operators on the physical layer shapes.

5. Derived Layer Store 114

The Derived Layer Store 114 serves as an intermediate store for derived layer shapes generated by the Derived Layer Generator 112. Freshly generated derived layer shapes are received by the Derived Layer Store 114 either from the Derived Layer Generator 112 or from older imported derived layer shapes from outside the system such as Disk 116 or network (not shown). The Derived Layer Store 114 is used by the Derived Layer Visualizer 122 to interactively show derived layer shapes to a user.

6. Derived Layer Deserializer 118 and Derived Layer Serializer 120

Derived Layer Serializer 120 is a module to export all information to be exported to external format (typically XML format but it can be other formats). The information can be later imported to a DRC tool by the Derived Layer Deserializer 120.

7. Derived Layer Visualizer and Debugger 122

The Derived Layer Visualizer and Debugger 122 comprise three sub-modules. Those sub-modules are Final Derived Layer Shape Visualizer 124, Step by Step Intermediate Derived Layer Shape Visualizer 126, and Derived Layer Operator Explanation 128. The operation of each of these sub-modules will be described further in the paragraphs below.

a. Final Derived Layer Shape Visualizer 124 (on Canvas)

The Final Derived Layer Shape Visualizer 124 is responsible for visualizing the final derived layer shapes on the layout canvas 130. This Final Derived Layer Shape Visualizer 124 can operate in tandem with a layout interaction module in which an editing physical layer shape can create, stretch, copy, move and carry out other operations. Corresponding derived layer shapes will be modified and presented to the user on the layout canvas 130.

Figure 5A:
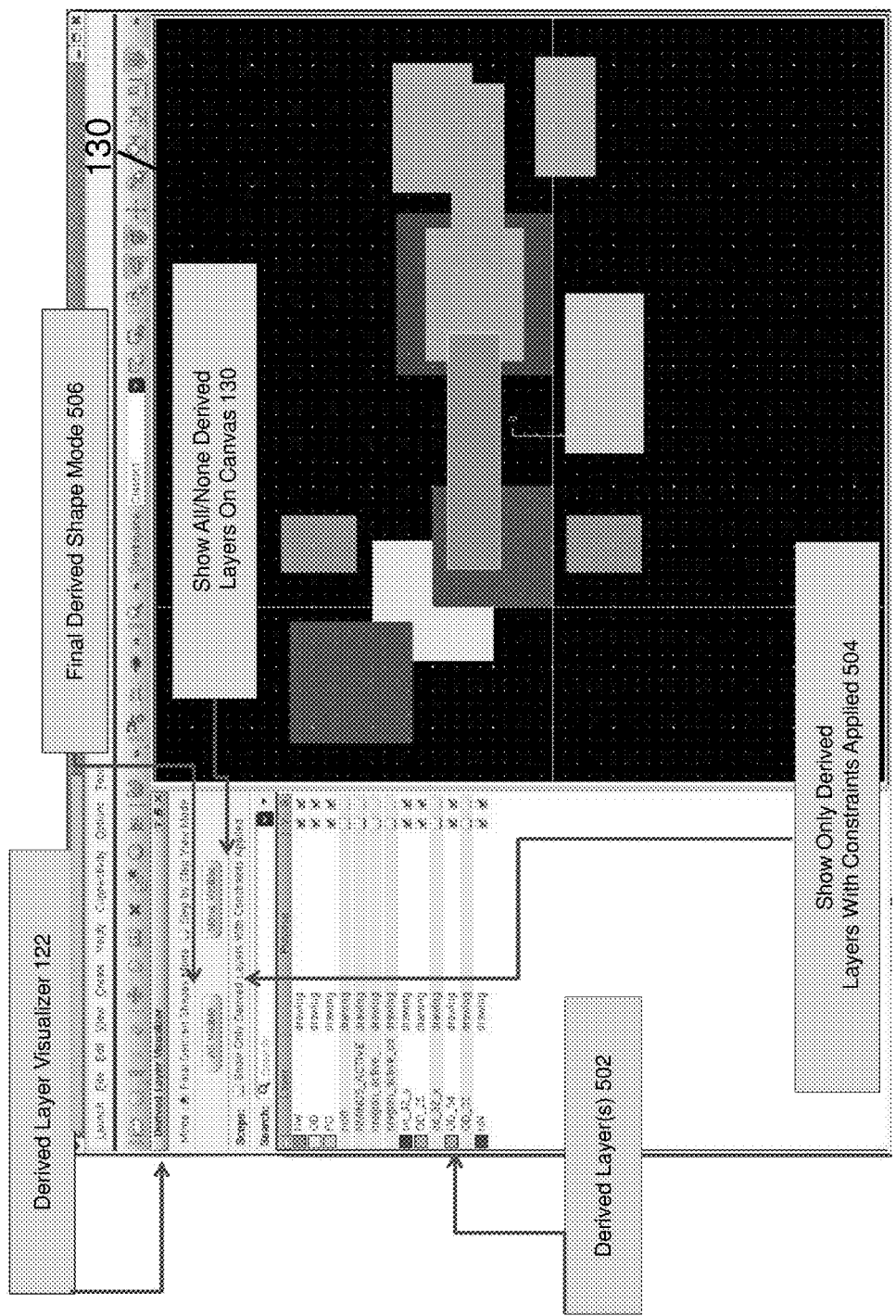
FIGS. 5A and 5B are sample screenshots that show the operation of the Final Derived Layer Shape Visualizer.
Figure 5B:
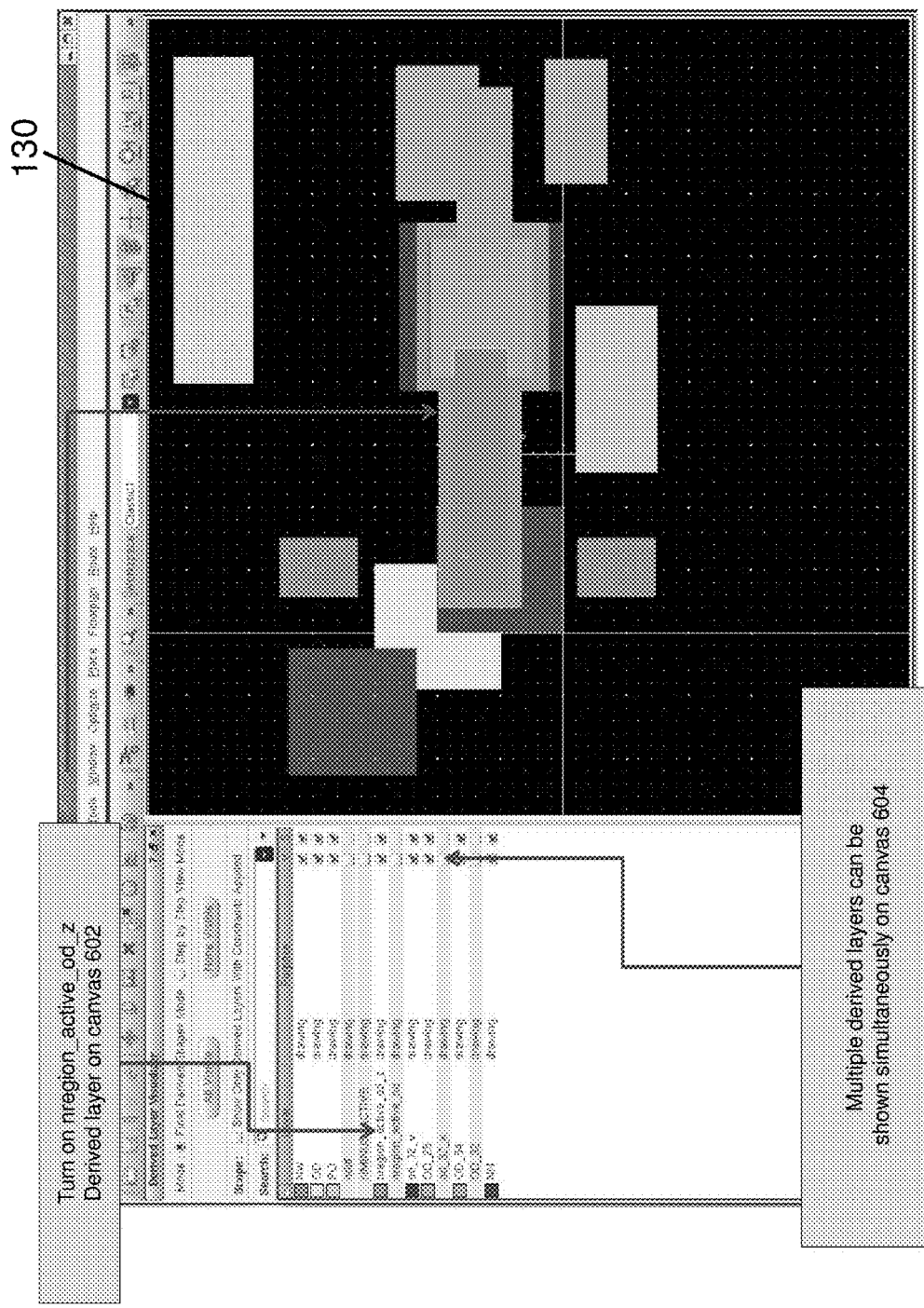

FIGS. 5A and 5B are sample screen shots that show the operations of the Final Derived Layer Shaper Visualizer 124. In FIG. 5A, the Derived Layer Visualizer and Debugger 122 is selected. Only derived layers 502 with constraints applied 504 are shown. The Final Derived Shape Mode 506 can show either all or none of the derived layers on the layout canvas 130. FIG. 5B shows a screenshot of nregion_active_od_z turned on, which is a derived layer on the layout canvas 130. This makes it possible to show multiple derived layers 604 simultaneously on the canvas 130.

b. Step by Step Intermediate Derived Layer Shape Visualizer 126

Another aspect of the present invention is the Step by Step Intermediate Derived Layer Shape Visualizer 126. It further comprises a Step by Step Visualization Assistant 132 which controls an Intermediate Derived Layer Shape Animator 134 and an Intermediate Derived Layer Hierarchy Tree Visualizer 136. The Intermediate Derived Layer Hierarchy Tree Visualizer 136 works in tandem with the Intermediate Derived Layer Shape Animator 134 module based upon intersections with the Step by Step Visualization Assistant 132. The intermediate derived layer or physical layer nodes are added or deleted corresponding to each "next" or "back" button click, respectively, giving details of current layers on which operation is performed along with operator and parameter applied information. To describe their operations, refer now to the following description in conjunction with the accompanying FIGS. 5-16.

(i) Intermediate Derived Layer Shape Animator 134

The Intermediate Derived Layer Shape Animator 134 provides detailed level step-by-step information about derived layer shapes generation. This module can present the shape generation in two modes: (i) a top level mode (e.g., derived layer shapes and then proceed down to physical layer shapes); or (ii) a bottom level mode (e.g., physical layer shapes and then proceed up till creation of derived layer shapes). For example, in the bottom level mode where initial physical layer 1 and physical layer 2 shapes are shown by the Step by Step Assistant 132, when the user clicks the "next" button, the application of an operator is presented to user on the layout canvas in terms of new shapes generation (in custom format like a shape filled with a color or pattern) and physical layer shapes (in other custom format like dotted outline). On clicking "next", old physical layer shapes disappear, and intermediate derived layer along with the next applicable physical/derived layer becomes visible for a next operator applicability. The mode continues until final derived layer shapes are generated. The animation process can be performed in reverse order by clicking the "back" button.

(ii) Intermediate Derived Layer Hierarchy Tree Visualizer 136

The Intermediate Derived Layer Hierarchy Tree Visualizer 136 shows the hierarchy of the intermediate derived layers in a tree-like fashion corresponding to the derived layer shapes shown by the Step by Step Visualization Assistant 132.

Figure 6:
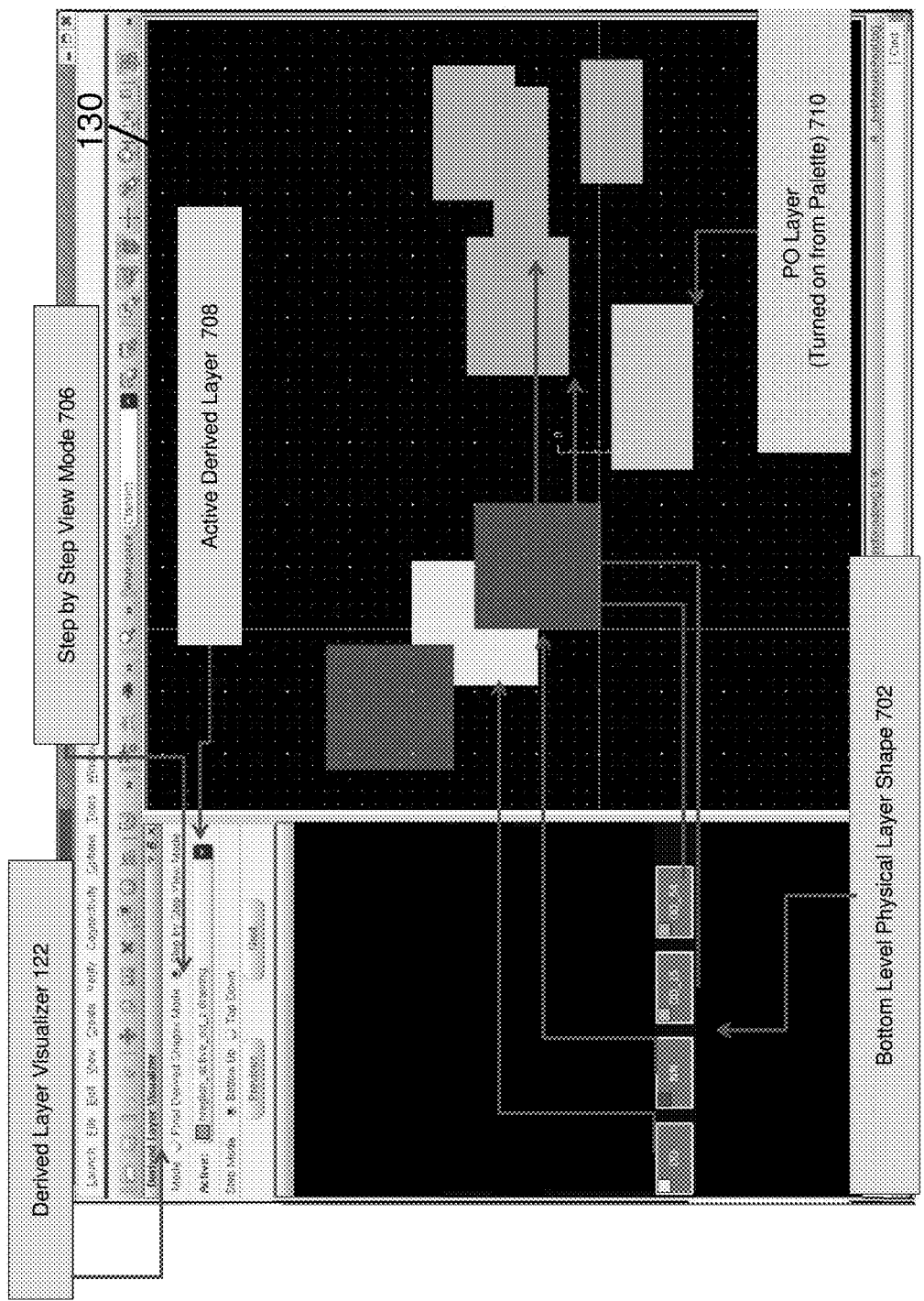
FIGS. 6-16 are sample screen shots that show the operation of the Step by Step Intermediate Derived Layer Shape Visualizer.

FIGS. 6-16 are screen shots that show the operation of the Step by Step Intermediate Derived Layer Shape Visualizer 126. FIG. 6 shows a bottom level physical layer shape 702. In this FIG. 6, the Derived Layer Visualizer 122 is selected and Step by Step View Mode 706 is selected. The Active Derived Layer 708 is shown.

Figure 7:
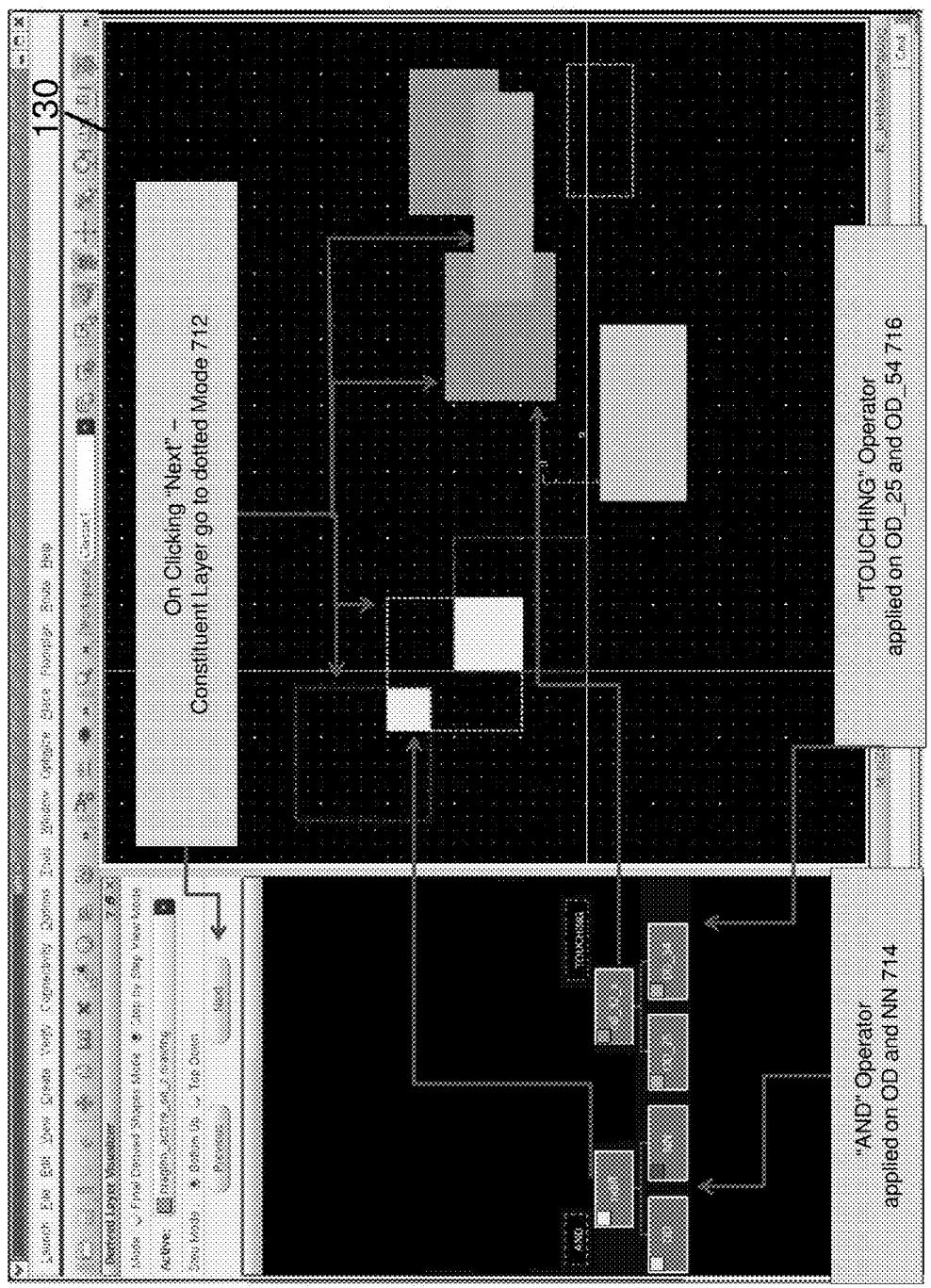
Figure 8:
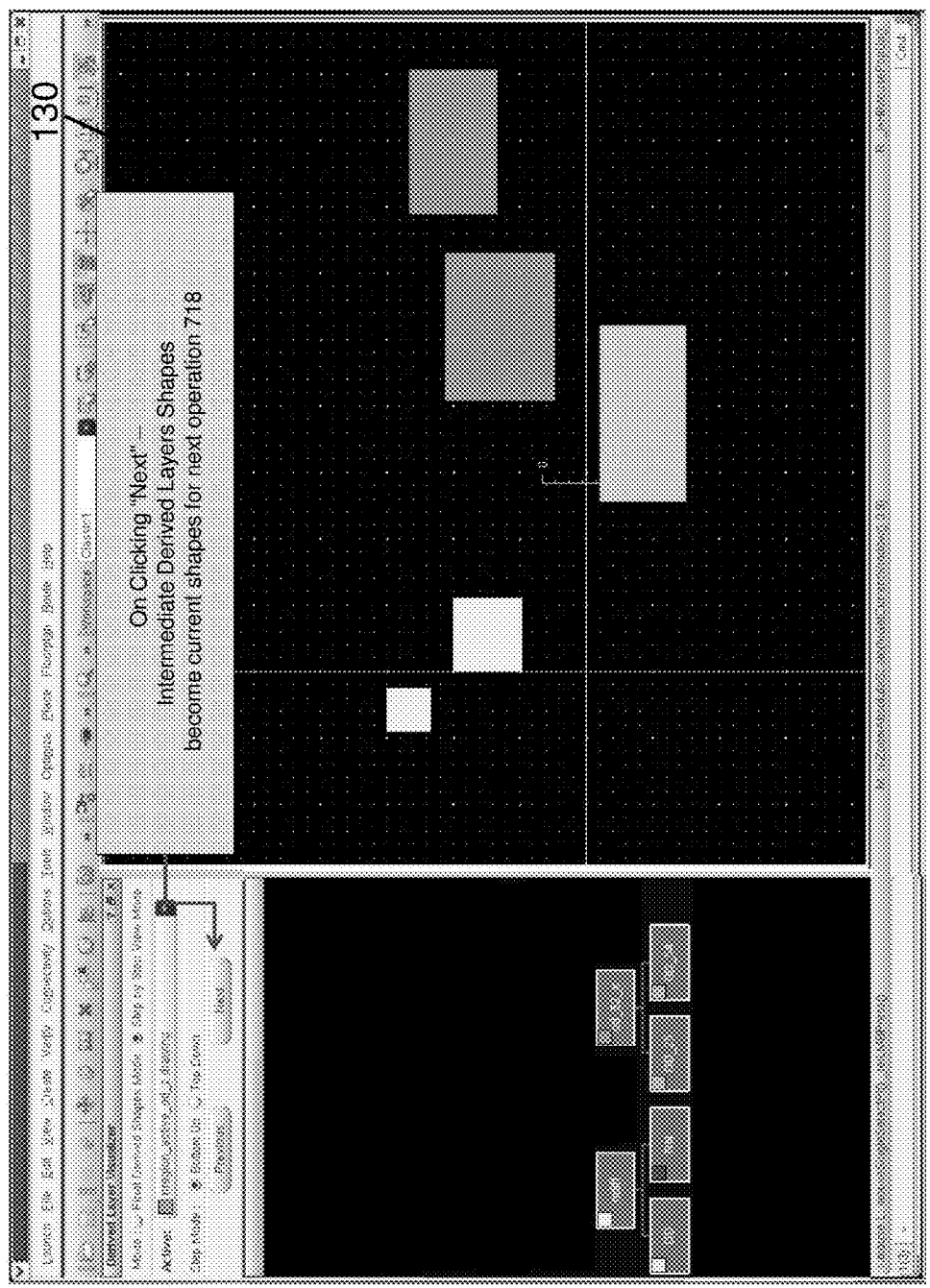
Figure 9:
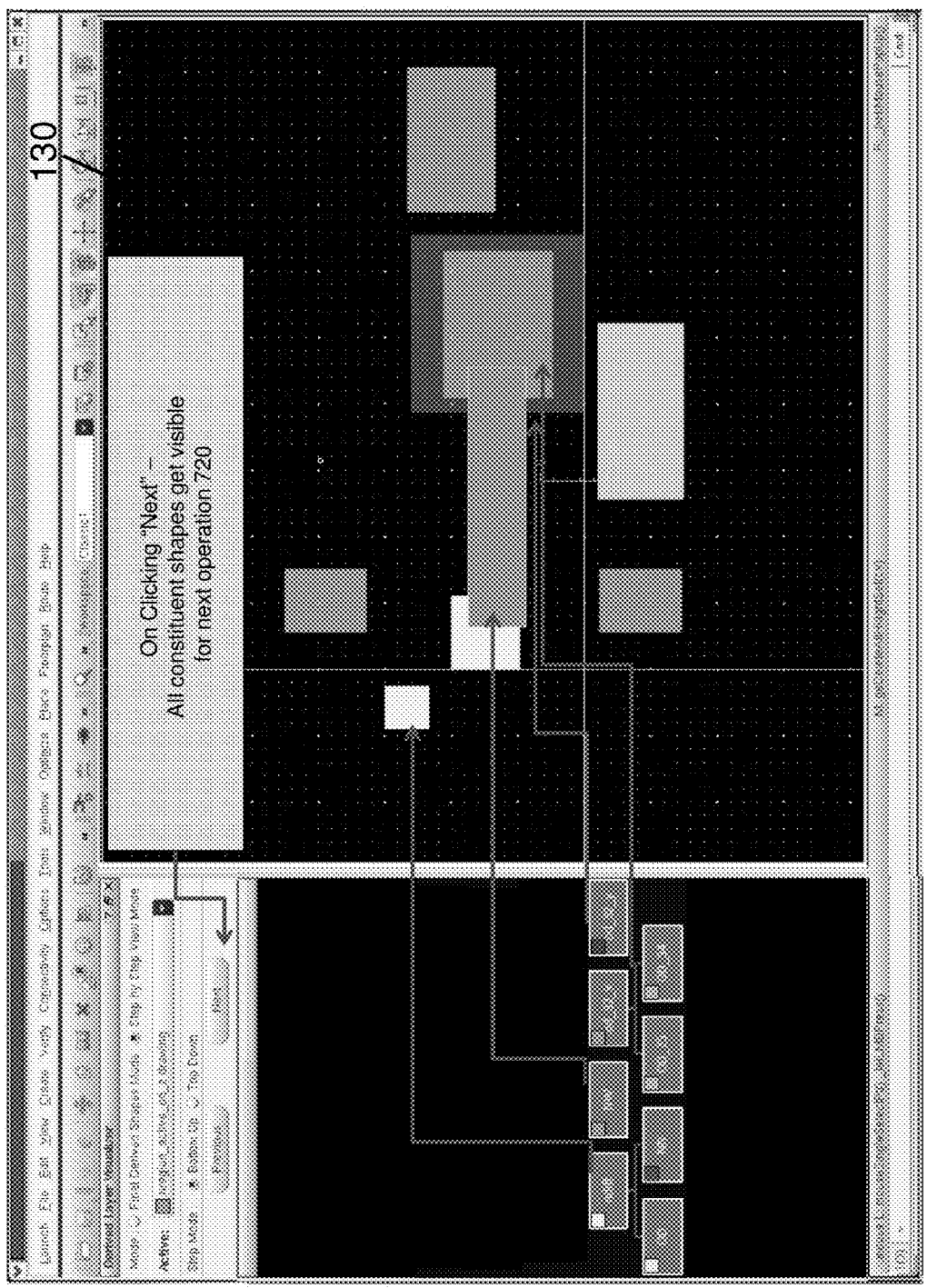
Figure 10:
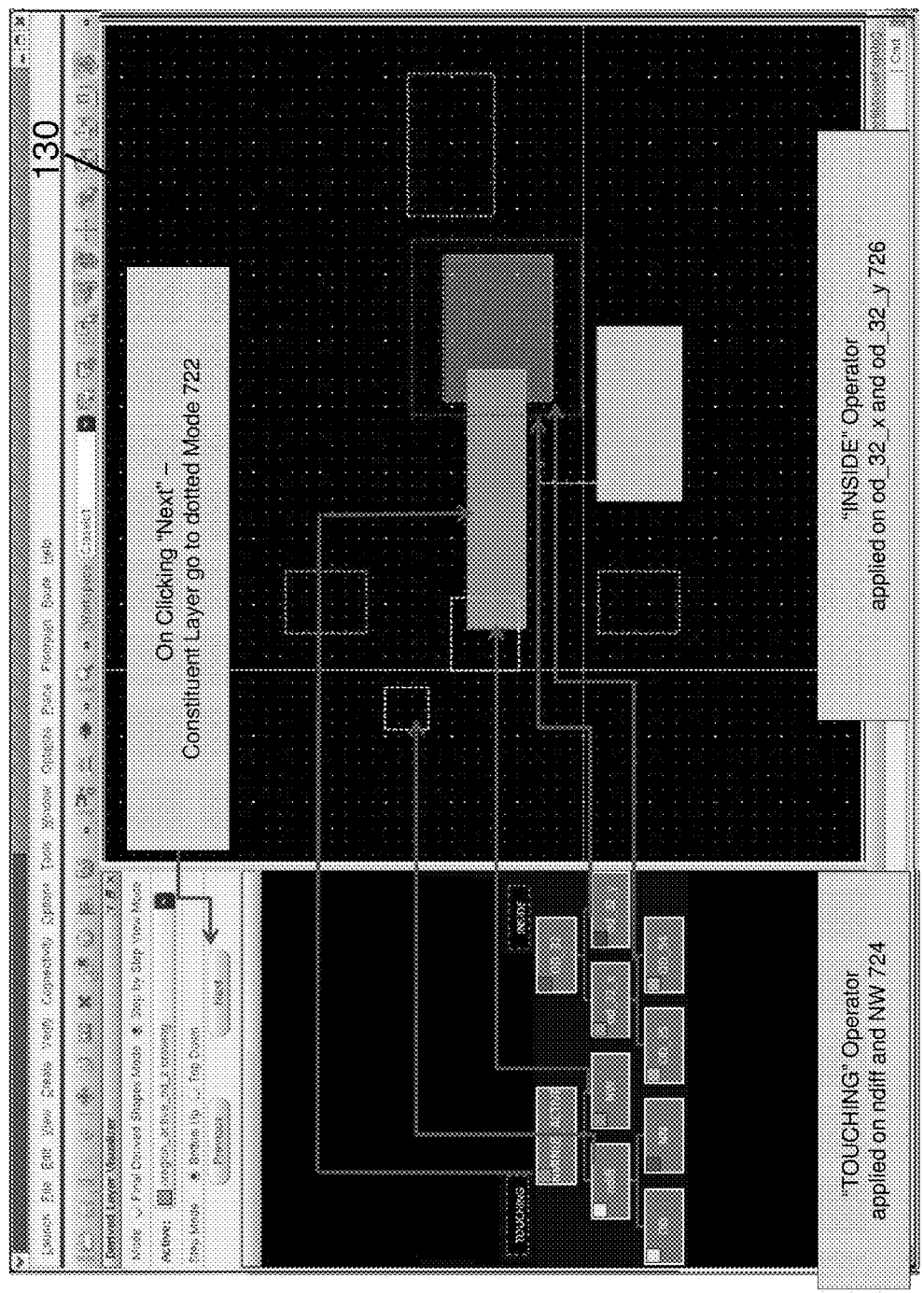

By clicking "next", as shown in FIG. 7, the user engages a dotted mode operation 712 where a constituent layer is now dotted. The "and' operator is applied on OD and NN 714. A "touching" operator is applied on OD_25 and OD_54 716. By clicking "next", as shown in FIG. 8, it takes the user to an operation 718 in which the intermediate derived layer shapes become current shapes 718 for the next operation 720. By clicking "next" for operation 720, as shown in FIG. 9, all constituent shapes then become visible for the next operation 722.

Figure 11:
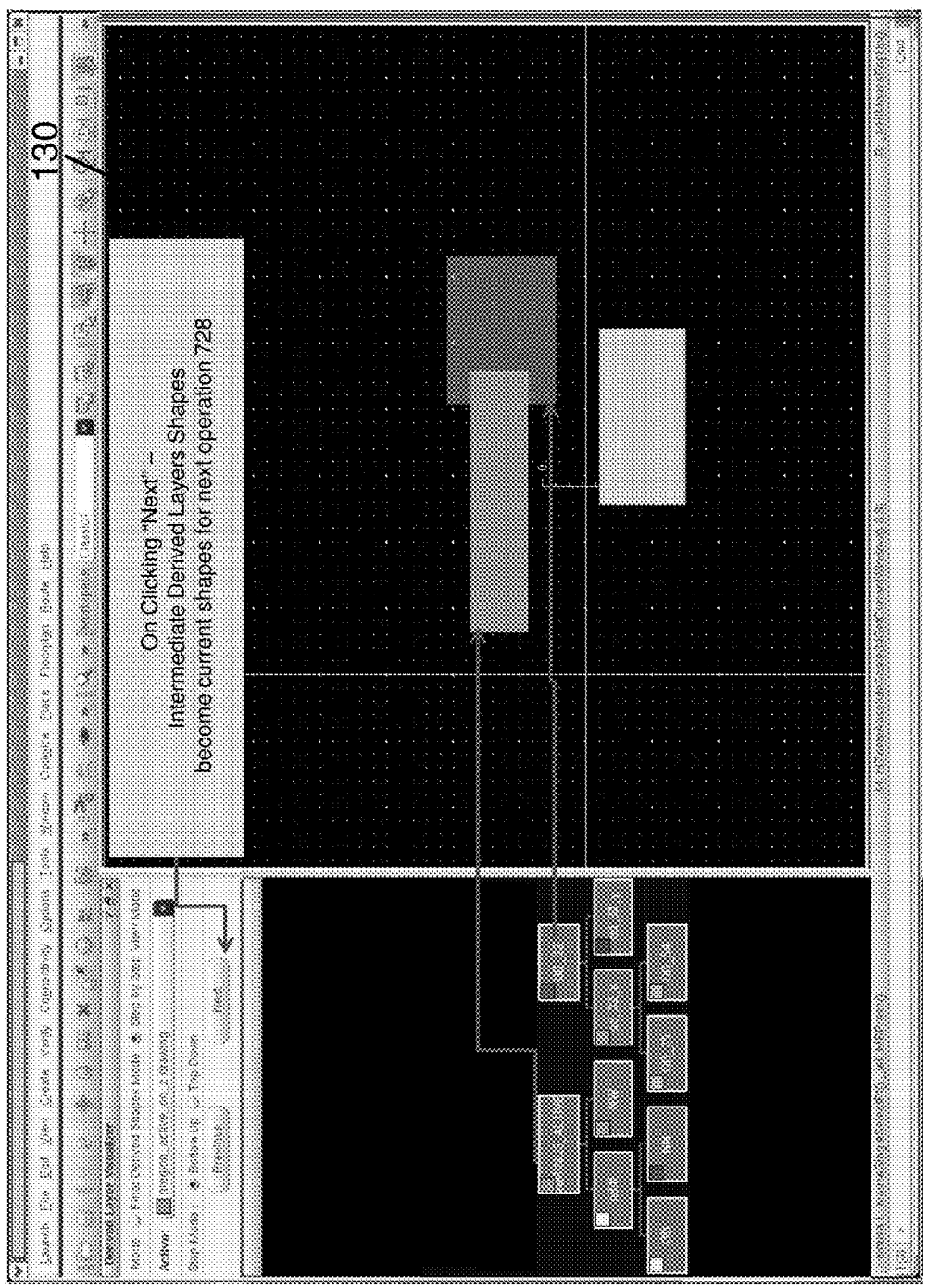
Figure 12:
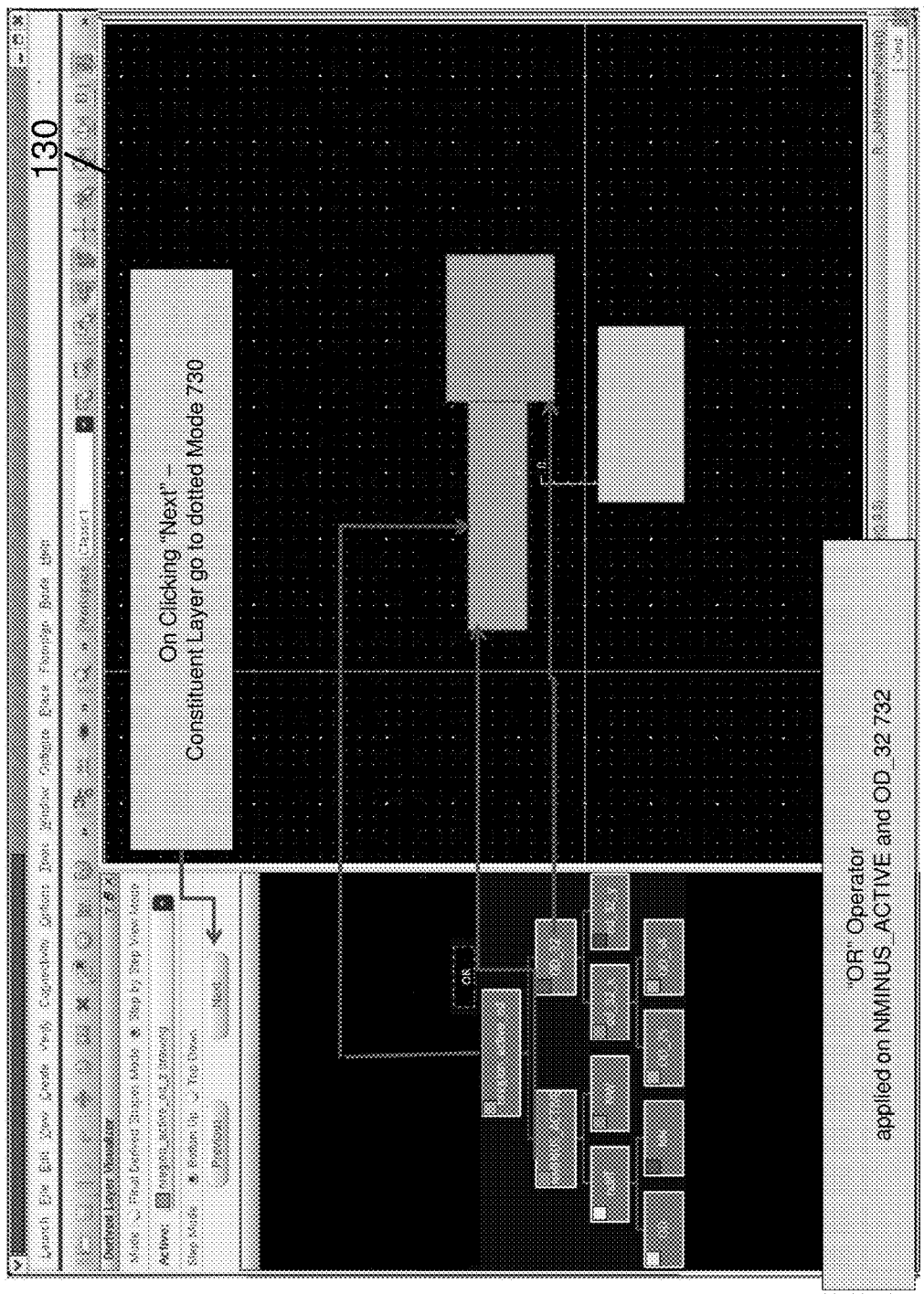

By clicking "next", as shown in FIG. 1C, a dotted mode operation 722 is engaged, where the constituent layer goes is dotted. The "touching" operator is applied on ndiff and nw 724. The "Inside" operator is applied on od_32_x and od_32_y 726. By clicking "next", as shown in FIG. 11, it takes the user to an operation 728 where intermediate derived layers shapes become current shapes for a next operation. By clicking "next", as shown in FIG. 12, a dotted mode operation 730 is engaged, where a constituent layer is now dotted, and the "or" operator is applied on NMINUM_ACTIVE and OD_32 732.

Figure 13:
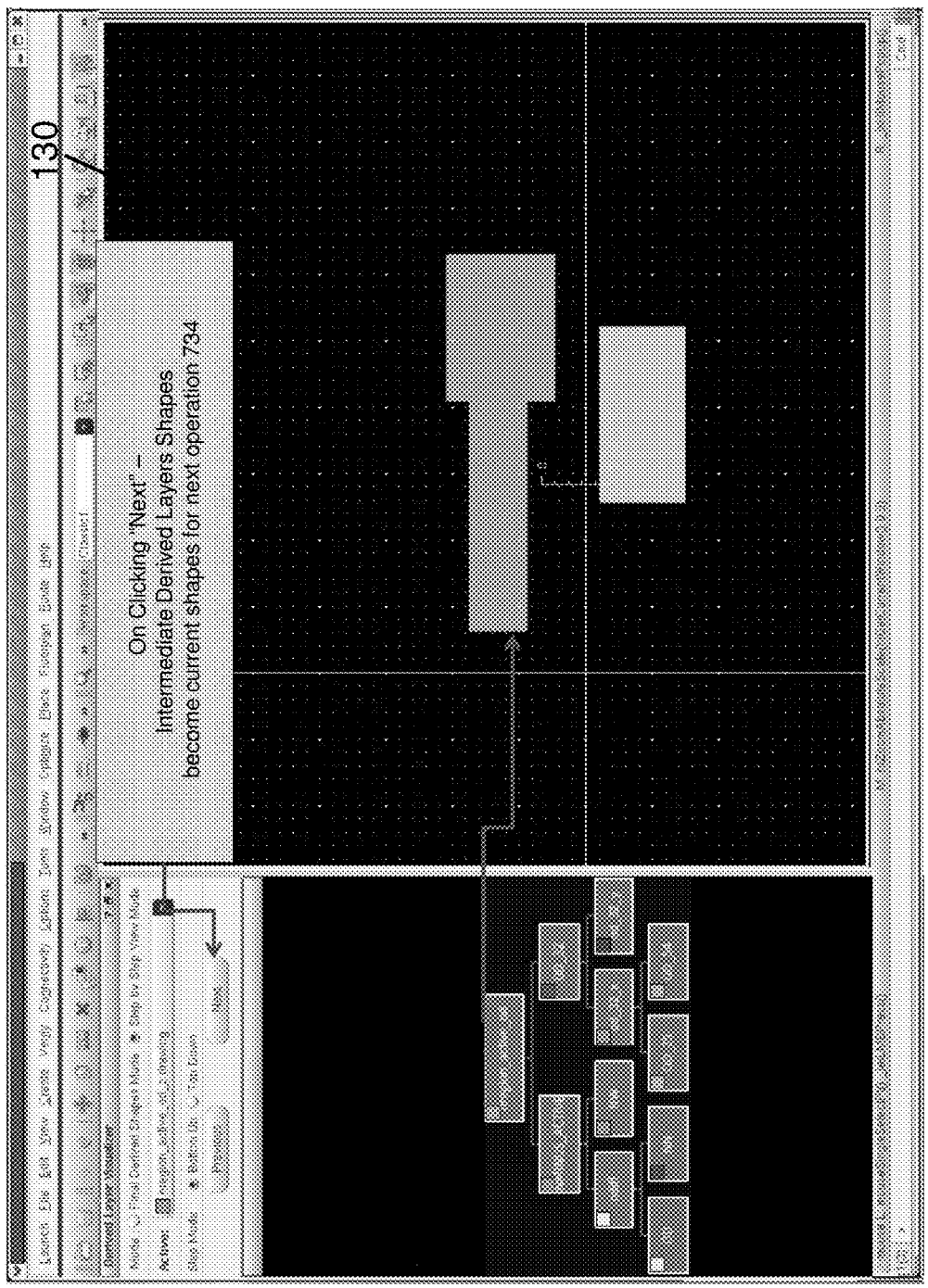
Figure 14:
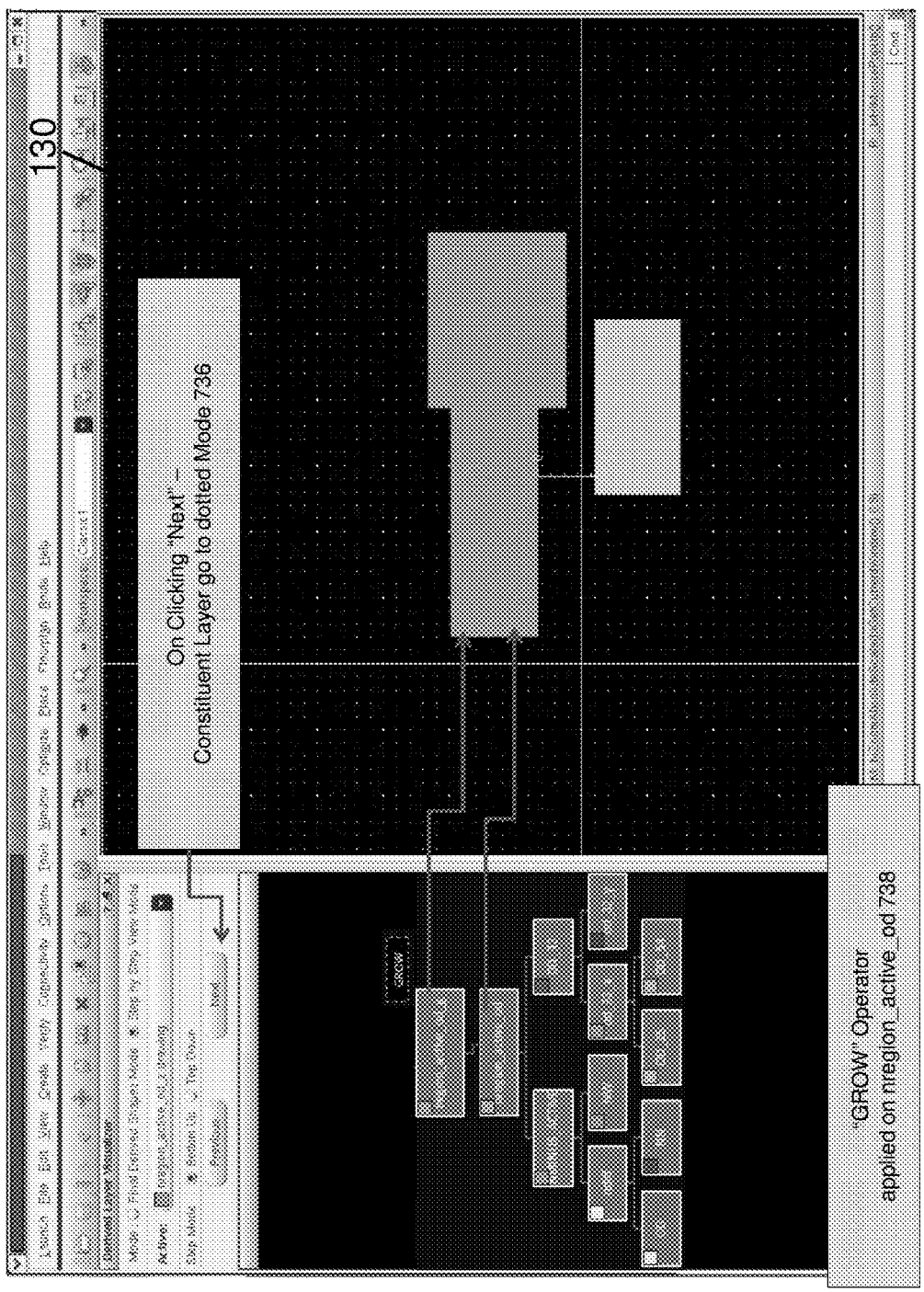
Figure 15:
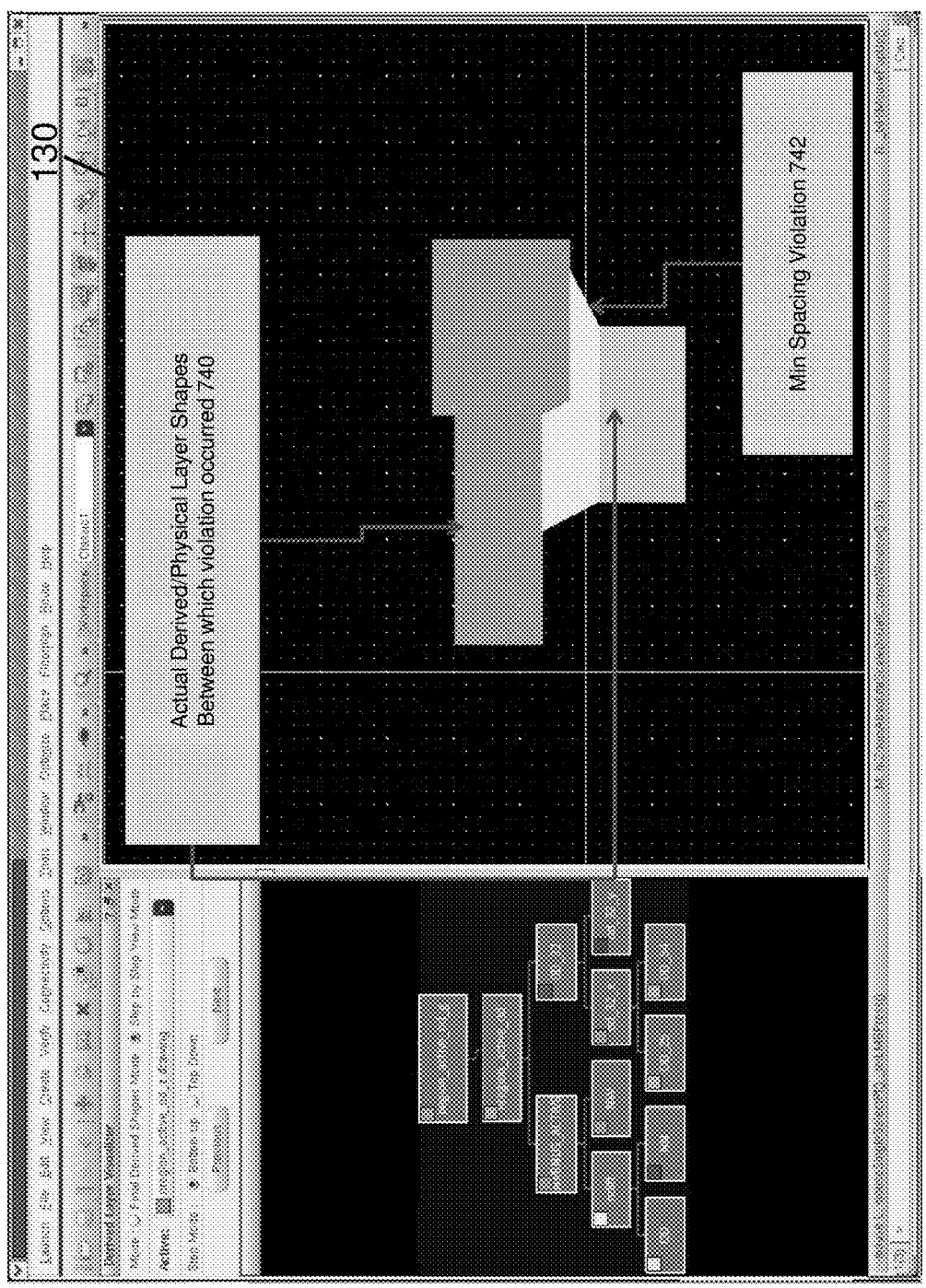
Figure 16:
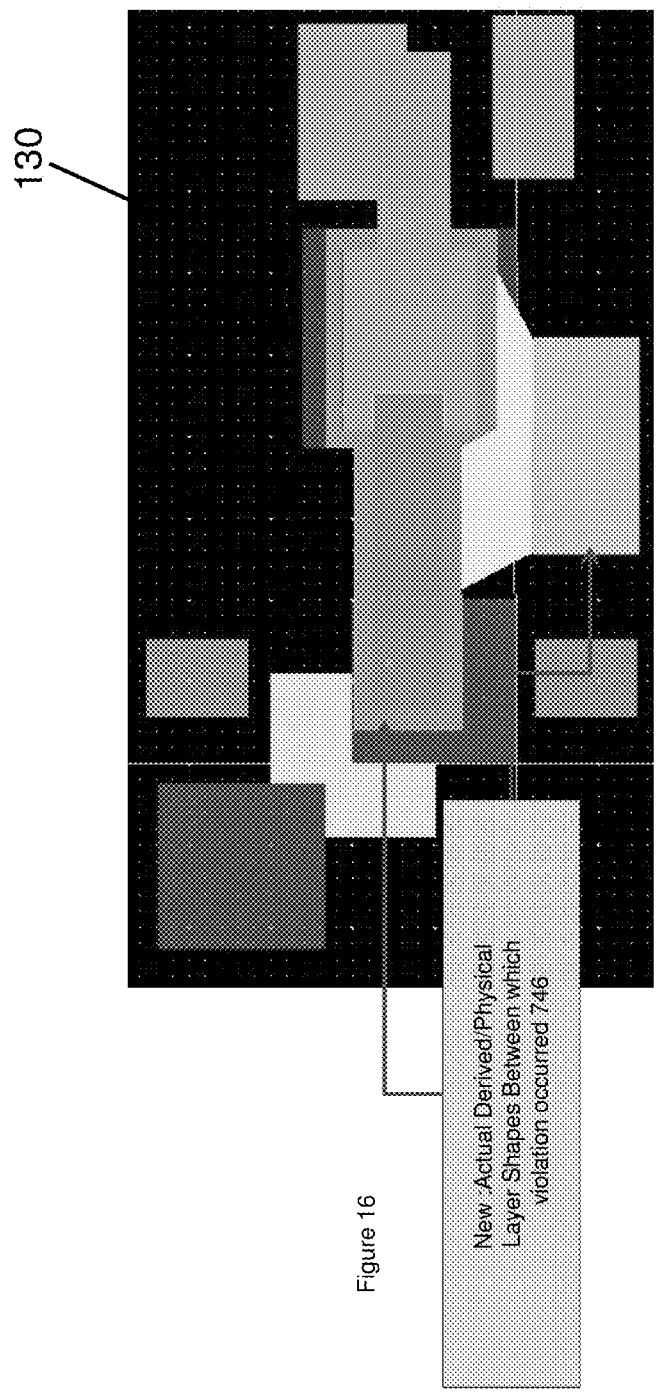

By clicking "next", as shown in FIG. 13, it takes the user to an operation 734 where intermediate derived layers shapes become current shapes for a next operation. By clicking "next", as shown in FIG. 14, constituent layer goes to dotted when mode in operation 736 is engaged, and the "grow" operator is applied on nregion_active_od 738. Finally as shown in FIG. 15, the actual derived/physical layer shapes where the violation 746 has occurred is shown. In this case there is a minimum spacing violation 742. FIG. 16 shows the merged derived/physical layer shapes between which the violation 746 occurred.

8. Derived Layer Operator Explanation 128

The Derived Layer Operator Explanation 128 provides a link to the formal specification of the derived layer operator in the product/company documentation.

System Overview

FIG. 17 illustrates a data processing system 800 suitable for storing the computer program product and/or executing program code in accordance with an embodiment of the present invention. The data processing system 800 includes a processor 802 coupled to memory elements 804*a-b* through a system bus 806. In other embodiments, the data processing system 800 may include more than one processor and each processor may be coupled directly or indirectly to one or more memory elements through a system bus.

Memory elements 804*a-b* can include local memory employed during actual execution of the program code, bulk storage, and cache memories that provide temporary storage of at least some program code in order to reduce the number of times the code must be retrieved from bulk storage during execution. As shown, input/output or I/O devices 808*a-b* (including, but not limited to, keyboards, displays, pointing devices, etc.) are coupled to the data processing system 800. I/O devices 908*a-b* may be coupled to the data processing system 800 directly or indirectly through intervening I/O controllers (not shown).

In FIG. 17, a network adapter 810 is coupled to the data processing system 802 to enable data processing system 802 to become coupled to other data processing systems or remote printers or storage devices through communication link 812. Communication link 812 can be a private or public network. Modems, cable modems, and Ethernet cards are just a few of the currently available types of network adapters.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A computer-implemented method for visualizing derived layer shapes of an integrated circuit design comprising:

visualizing the derived layer shapes on a layout canvas;

providing a step by step process for visualizing each intermediate shape until final derived layer shapes are generated, wherein the step by step process displays information that includes derived layer operators that are applied on each intermediate shape; and providing a hierarchy of intermediate shapes and physical layer shapes corresponding to the final derived layer shapes based upon the step by step process.

2. The computer-implemented method of claim 1, wherein the hierarchy is in a tree-like fashion.

3. The computer-implemented method of claim 1, wherein the step by step process is provided by starting from the derived layer shapes to the physical layer shapes.

4. The computer-implemented method of claim 1, wherein the step by step process is provided by starting from the physical layer shapes to the derived layer shapes.

5. The computer-implemented method of claim 1, wherein initial physical layer shapes are shown, then new shapes are generated on the layout canvas in a first custom format and physical layer shapes are generated in a second custom format based upon a first operation; when moving forward to the next level the initial physical layer shapes disappear and at least one intermediate shape along with a next applicable physical/derived layer shape becomes visible based upon a second operation, this process continues until the final derived layer shapes are generated.

6. The computer-implemented method of claim 5, wherein the first custom format comprises the new shapes being filled with any of a color and a pattern and the second custom format comprises the physical layer shapes being in a dotted line.

7. The computer-implemented method of claim 5, wherein any of intermediate derived layer nodes and physical layer nodes are added/deleted; wherein details of current layers on which operation is performed along with operator and parameters applied information are provided.

8. A computer program product for visualizing derived layer shapes of an integrated circuit design, the computer program product comprising a non-transitory computer-readable medium having program code embodied therewith, the program code executable by a computer to;

visualizing the derived layer shapes on a layout canvas;

provide a step by step process for visualizing each intermediate shape until final derived layer shapes are generated, wherein the step by step process displays information that includes derived layer operators that are applied on each intermediate shape; and provide a hierarchy of intermediate shapes and physical layer shapes corresponding to the final derived layer shapes based upon the step by step process.

9. The computer program product of claim 8, wherein the hierarchy is in a tree fashion.

10. The computer program product of claim 8, wherein the step by step process is provided by starting from the derived layer shapes to the physical layer shapes.

11. The computer program product of claim 8, wherein the step by step process is provided by starting from the physical layer shapes to the derived layer shapes.

12. The computer program product of claim 8, wherein initial physical layer shapes are shown, then new shapes are generated on the layout canvas in a first custom format and physical layer shapes are generated in a second custom format based upon a first operation; when moving forward to the next level the initial physical layer shapes disappear and at least one intermediate shape along with a next applicable physical/derived layer shape becomes visible based upon a second operation, this process continues until the final derived layer shapes are generated.

13. The computer program product of claim 12, wherein the first custom format comprises the new shapes being filled with any of a color and a pattern and the second custom format comprises the physical layer shapes being in a dotted line.

14. The computer program product of claim 12, wherein any of intermediate derived layer nodes and physical layer nodes are added/deleted; wherein details of current layers on which operation is performed along with operator and parameters applied information are provided.

15. A system for visualizing derived layer shapes of an integrated circuit design comprising:
a derived layer visualizer for visualizing the derived layer shapes on a layout canvas; and
an intermediate derived layer shape visualizer for providing a step by step process for visualizing each intermediate shape until final derived layer shapes are generated, wherein the step by step process displays information that includes derived layer operators that are applied on each intermediate shape; and for providing a hierarchy of intermediate shapes and physical layer shapes corresponding to the final derived layer shapes based upon the step by step process.

16. The system of claim 15, wherein the hierarchy is in a tree-like fashion.

17. The system of claim 15, wherein the step by step process is provided by starting from the derived layer shapes to the physical layer shapes.

18. The system of claim 15, wherein the step by step process is provided by starting from the physical layer shapes to the derived layer shapes.

19. The system of claim 15, wherein initial physical layer shapes are shown, then new shapes are generated on the layout canvas in a first custom format and physical layer shapes are generated in a second custom format based upon a first operation; when moving forward to the next level the initial physical layer shapes disappear and at least one intermediate shape along with a next applicable physical/derived layer shape becomes visible based upon a second operation, this process continues until the final derived layer shapes are generated.

20. The system of claim 19, wherein the first custom format comprises the new shapes being filled with any of a color and a pattern and the second custom format comprises the physical layer shapes being in a dotted line.

21. The system of claim 19, wherein any of intermediate derived layer nodes and physical layer nodes are added/deleted; wherein details of current layers on which operation is performed along with operator and parameters applied information are provided.

* * * * *